(12) United States Patent
Marshall

(10) Patent No.: US 7,397,085 B2
(45) Date of Patent: Jul. 8, 2008

(54) THERMAL COUPLING OF MATCHED SOI DEVICE BODIES

(75) Inventor: Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1610 days.

(21) Appl. No.: 10/007,332

(22) Filed: Nov. 8, 2001

(65) Prior Publication Data

US 2002/0084472 A1    Jul. 4, 2002

Related U.S. Application Data

(60) Provisional application No. 60/259,321, filed on Dec. 31, 2000, provisional application No. 60/279,980, filed on Mar. 29, 2001.

(51) Int. Cl.
*H01L 27/12* (2006.01)

(52) U.S. Cl. ............... 257/347; 257/369; 257/401; 257/506

(58) Field of Classification Search ............ 257/347, 257/369, 401, 506
See application file for complete search history.

(56) References Cited

U.S. PATENT DOCUMENTS

| | | | |
|---|---|---|---|
| 5,378,919 A | | 1/1995 | Ochiai |
| 5,489,792 A | | 2/1996 | Hu et al. |
| 5,724,336 A | | 3/1998 | Morton |
| 5,895,956 A | * | 4/1999 | Oowaki et al. ............... 257/350 |
| 6,037,808 A | * | 3/2000 | Houston et al. ............... 327/55 |
| 6,072,224 A | | 6/2000 | Tyson et al. |
| 6,087,894 A | * | 7/2000 | Barrett et al. ............... 327/543 |
| 6,104,068 A | | 8/2000 | Forbes |
| 6,133,608 A | * | 10/2000 | Flaker et al. ............... 257/347 |
| 6,624,459 B1 | * | 9/2003 | Dachtera et al. ............ 257/296 |

FOREIGN PATENT DOCUMENTS

JP    6244420    9/1994

* cited by examiner

*Primary Examiner*—Matthew E Warren
(74) *Attorney, Agent, or Firm*—Rose Alyssa Keagy; W. James Brady, III; Frederick J. Telecky, Jr.

(57) ABSTRACT

Performance matching devices in SOI are improved by thermally isolating matched devices within a continuous body of active material. Matched devices are isolated by an insulating wall of silicon dioxide (which surrounds the devices) and the oxide layer beneath, and are arranged to minimize effects from external thermal sources.

9 Claims, 6 Drawing Sheets

THERMAL COUPLING OF MATCHED SOI DEVICE BODIES

This application claims priority under 35 U.S.C. §119(e)(1) of provisional application Nos. 60/259,321 filed Dec. 31, 2000 and 60/279,960 filed Mar. 29, 2001.

BACKGROUND AND SUMMARY OF THE INVENTION

The present invention relates to semiconductor-on-insulator integrated circuit structures and fabrication methods.

Background

Semiconductor on Insulator (SOI) material is being used for digital applications, where it is able to produce material that has significantly improved performance over the conventional (bulk) material. SOI has two disadvantages when attempts are made to do analog design. These disadvantages are impaired thermal dissipation due to the oxide under the active components, and the fact that the transistor body is typically left floating.

Power is dissipated in the MOS channel as a result of the current through the channel and the voltage across it. Due to the poor thermal conductivity of SOI compared to bulk, the temperature of the layer above the buried oxide may increase significantly just in the power-dissipating device. This affects the characteristics of the device. The most typical effects of self-heating within a device are for the device to exhibit reduced threshold voltage and drive current, and to show increased leakage.

Self-heating effects are of highest significance in devices where continuous current flows through a device that is biased with the source and drain at a significant voltage separation (e.g., Vds=1v). This occurs most often in analog designs. One of the simplest analog circuits in which this is important is the current mirror.

For analog circuitry where there is a matching requirement, the floating body can be an issue because of its history effect, which can leave adjacent devices with different body voltages. Body voltage variation directly causes Vt variation. Body voltage is the voltage on the parasitic base of the SOI transistor. As body voltage increases, the threshold voltage of the device decreases due to body biasing effects.

Typically, body ties are used to alleviate the problems of a floating body. The layout is modified so that a body connection can be brought out from the device. Though this method can solve some of the problems, it does not address thermal mismatch, and takes additional silicon area to bring out the body tie.

Using SOI, the oxide layer alleviates the need for a body tie. However, the insulator used in SOI devices can have as much as 100 times the thermal resistance as the semiconductor material, which causes the devices to heat up when turned on.

Misalignments of poly on the gates of coupled devices can cause process variations between them as well. Though a slight misalignment of the poly will not affect threshold voltage, it will affect the drive currents, because of the difference between the source and drain widths caused by the misalignment.

Thermal Coupling of Matched SOI Device Bodies

The present inventor has realized that SOI implementation of analog circuits presents a possible problem of thermal differences between devices which are supposed to be matched. This problem is caused by the great difference in thermal conductivity between the insulating and semiconductor materials typically used for SOI. This problem can be solved by ensuring that the bodies of supposedly matched devices are thermally coupled by at least some continuous route of non-insulating material. In the preferred embodiment this material is a semiconductor material.

In another embodiment, coupling is instead achieved by use of metal interconnects to thermally couple different devices. This variation has the advantage of thermally coupling devices in different silicon tanks, though the coupling is typically of lower quality.

Advantages of the disclosed methods and structures, in various embodiments, can include one or more of the following:

good thermal and electrical coupling between linked devices; thermal and electrical isolation from external sources

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

There are several embodiments of the present innovations, which will be described with respect to the relevant figures. All the variations shown in this application share the innovative concept of using a shared tank, or connected body of active material to thermally match devices. The contiguous devices are, in the preferred embodiment, surrounded by an insulating wall. The insulating wall is preferably formed of silicon dioxide, and extends to the oxide layer beneath the active layer in the preferred embodiment. By surrounding two or more devices, the insulating wall thermally couples the devices by, for example, preferentially allowing heat to propagate within the active silicon region. For example, if one device for some reason generates greater heat than the other device, their proximity and insulation from external heat sinks combined with the silicon thermal coupling will cause the two devices to track very closely.

The insulating tank also isolates the devices from external heat sources that can asymmetrically heat the devices, causing differences in performance. Some of the embodiments have better or worse consequences with respect to these aims, and are discussed more fully below.

Figure 1:
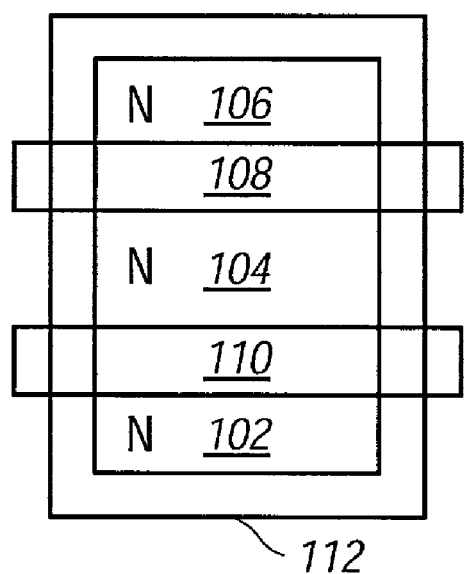
FIG. 1 shows a common source device according to a preferred embodiment.

FIG. 1 shows a shared tank implementation for a pair of common-source NMOS devices. The two devices are surrounded by an oxide barrier 112. Two drains 102, 106 are at either end, with a common source 104 in the center. On either side of the source area are gate structures 108, 110. The source electrically isolates the two transistors, but their temperatures track one another because the two devices are in the same insulator tank. The oxide tank surrounds the two transistors, which share a common source.

This is one of the simpler implementations of the present innovations. In this model, the two devices share a common source. The gates and the drains are also shown.

One limitation on this particular configuration is that external thermal gradients can affect one transistor more than the other. For example, if a heat source located nearer to one drain than the other has a steep thermal gradient, the entire tank will heat unevenly, and one of the transistors will then behave differently than the other due to changes in its threshold voltage.

Another asymmetry can adversely affect the coupled performance of the devices in such a shared tank setup. If the poly silicon that is deposited to form the gates is displaced in one direction, this will result in one device having a wider drain and a narrower source, while it causes the other device to have a narrower drain and a wider source. This difference in dimensions of course affects the performance of the coupled devices. The solution is to cross couple the devices in such a manner as to create symmetry to counteract any asymmetric forces, processes, or other effects, so that if there is a thermal gradient in one direction, the cross-coupled devices will experience similar heat increases. This is done both by electrically coupling specific transistors in the shared tank, as well as proper placement of coupled devices within the tank.

Figure 2:
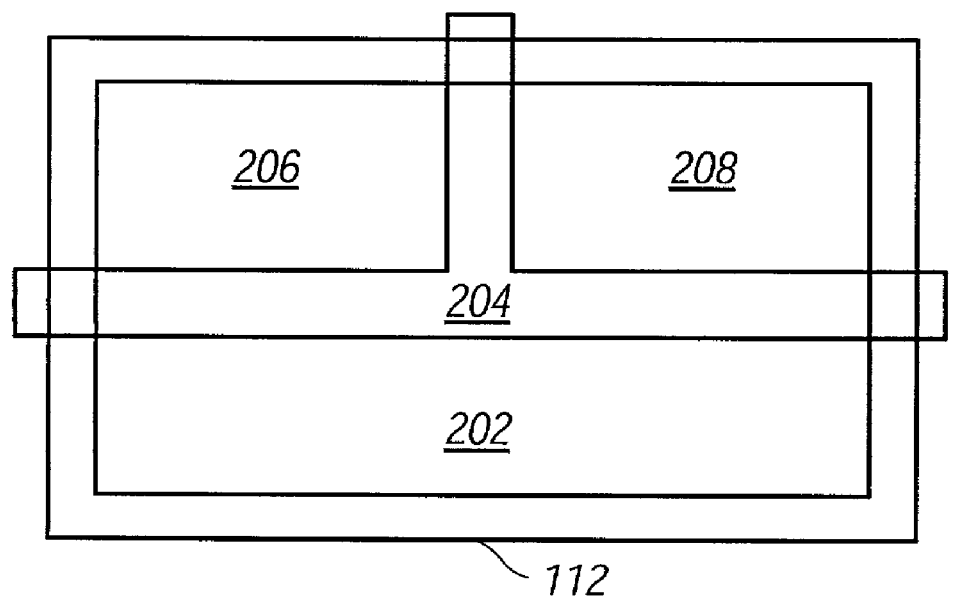
FIG. 2 shows a side-by-side pair of NMOS devices with shared source and gate.

FIG. 2 shows another embodiment of the present innovations. In this variant, an NMOS pair is shown in a side-by-side configuration. A common source 202 is adjacent to a shared gate structure 204. Two drains 206, 208 complete the pair. The source and gates are shared, as in a current mirror configuration. One advantage of this configuration is that the two devices share a body region, meaning that the bodies are electrically coupled as well as thermally coupled. This keeps the body voltage the same within the two devices, helping to keep performance of the devices the same.

Figure 3:
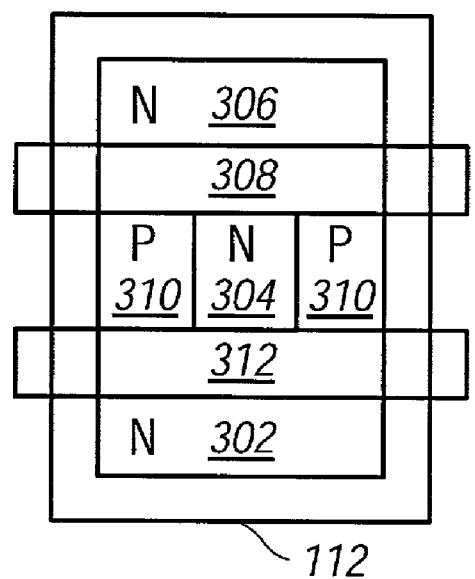
FIG. 3 shows a design which connects the bodies of two adjacent devices.

FIG. 3 shows an implementation which connects the p-type bodies of the two adjacent NMOS devices. This configuration is similar to that of FIG. 1, having a common source 304 with two gates 308, 312, and drains 302, 306. This variation couples the gates of the two devices together, which electrically couples the two devices as well as maintaining the thermal coupling. In this variation, two transistors are side by side within an insulating barrier, preferably made from an oxide. A common source is located between two n type drains. Two deep p doped regions 310 connect the two gates at either end of the common source, crossing the source region. Above the deep p doped connection regions is the normal n type doped material of the source.

Conventional current mirrors in bulk silicon often use cross coupled devices to eliminate process variability across a chip, and thermal gradients due to external sources. In the case of the examples described above, the devices are not cross coupled. The configuration in FIG. 4 can be used to implement a cross coupled pair of MOS devices sharing a common source. In this embodiment, the drains either have to be very close in voltage, or always higher than a Vtn below the gate voltage.

Figure 4:
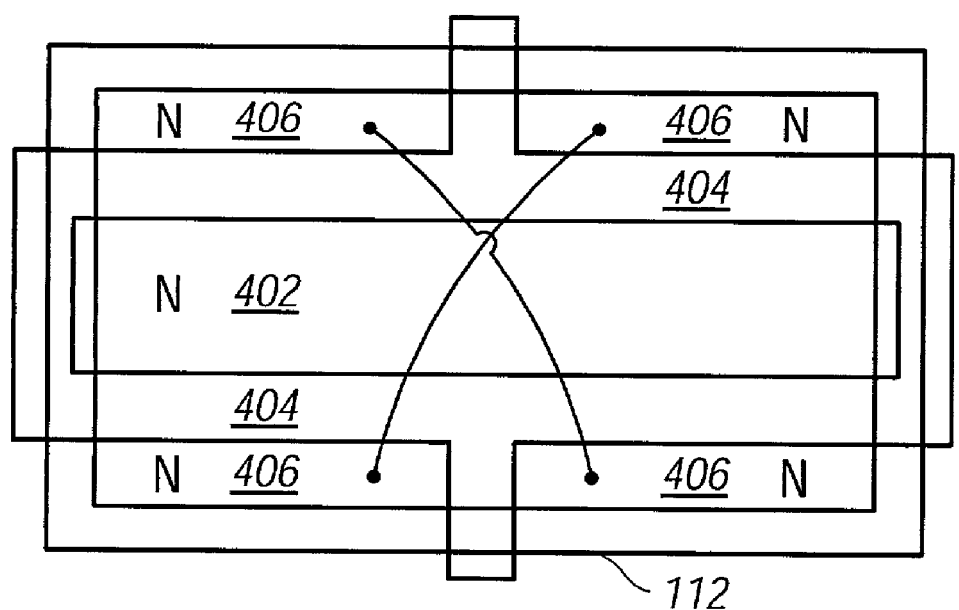
FIG. 4 shows a cross coupled layout with a common source.

FIG. 4 shows the cross coupled layout for SOI, accounting for thermal gradients due to external heat sources, process gradients, and also internal heating. The common source 402 has gates structures 404 on either side. The drains 406 of opposite devices are coupled as shown in the figure.

This layout is applicable when the MOS pair has to be matched to a common source. The oxide tank surrounds four transistors, all sharing a common source and gate. The opposite drains are also connected as shown.

Figure 5:
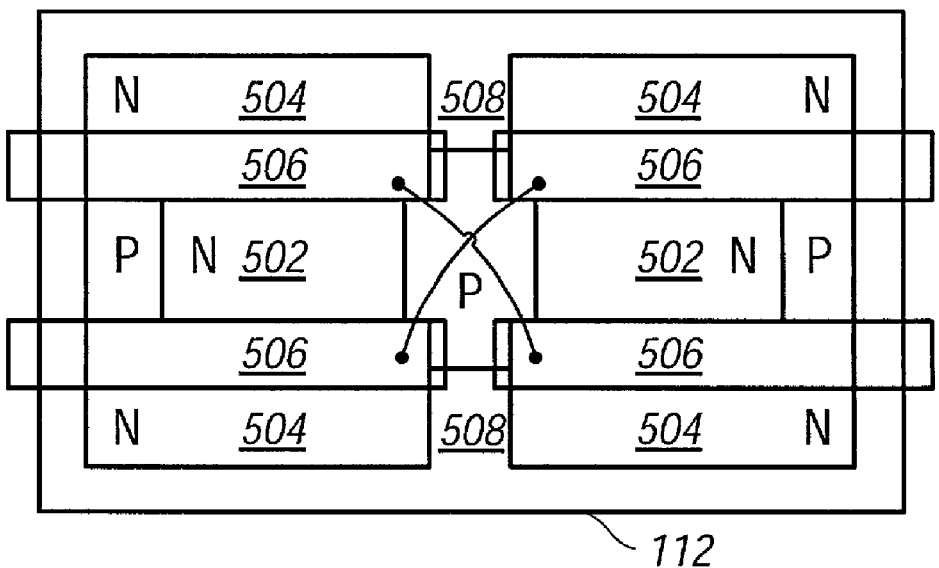
FIG. 5 shows a cross coupled input pair with common source and isolated cross-coupleable drains.

An enhancement to these structures that permits reasonable thermal coupling while allowing cross-coupling of the common source-tied pairs can be constructed as shown in FIG. 5. This structure comprises common sources 502 with gates 506, connected to drains 504 as shown in the figure. In this configuration, two source tied device pairs are cross coupled by metallization lines connecting their bodies or gates. An isolating oxide barrier 508 extends from the oxide wall 112 between two adjacent drains 504. This extension or finger of insulating material 508 is a deep trench isolation, and extends to the depth of the main oxide barrier 112.

Figure 6:
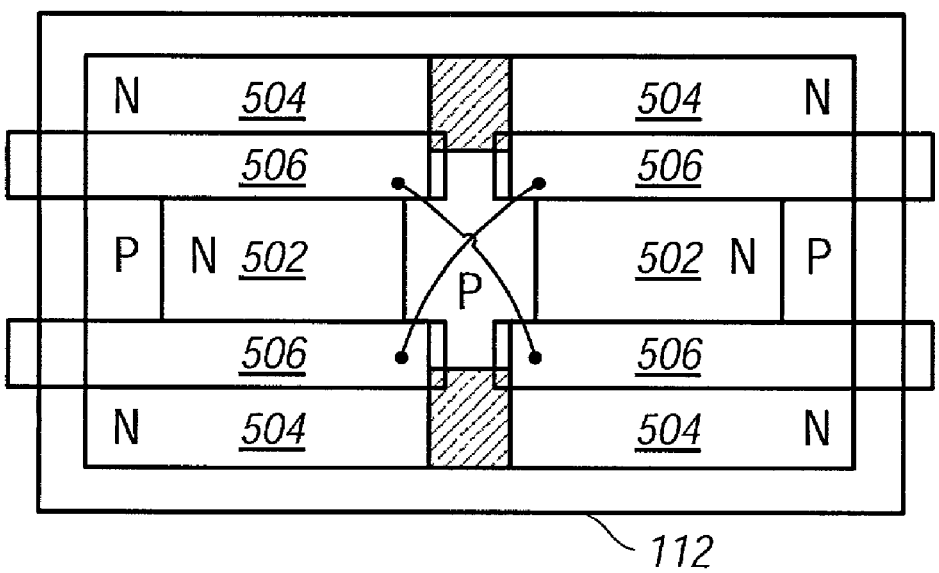
FIG. 6 shows a cross coupled input pair with a common source and isolated cross-coupleable drains, with a shallow isolation trench instead of a deep trench.

The thermal coupling of the above embodiment can be improved by only partially isolating the drains. Instead of the oxide separating finger extending through the material to the insulator beneath, this finger only extends part way to the underlying oxide. FIG. 6 shows such a variation. FIG. 6 shows a similar layout to that of FIG. 5, except that the drains are isolated by an oxide barrier that does not extend all the way down to the underlying oxide layer. Instead, the plug or finger_ that separates each drain pair only extends part of the way to the underlying insulating layer. In this embodiment, a p doped region is located beneath the separating oxide finger to electrically separate the two drains.

Figure 6A:
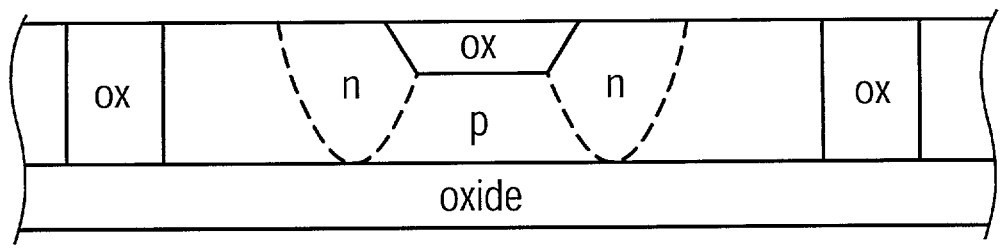
FIG. 6*a* shows a side view of a preferred embodiment.

FIG. 6a shows a side view of this embodiment. In this example with n-type drains, this "shallow trench" of insulator has a p doped region beneath it. This p region helps to electrically isolate the two devices' drains while allowing better thermal coupling than if the insulator were formed all the way down to the underlying insulator. Though this variation allows improved thermal coupling because the oxide trench only extends part way down through the active silicon, an additional mask step is required to implement this design.

Figure 7:
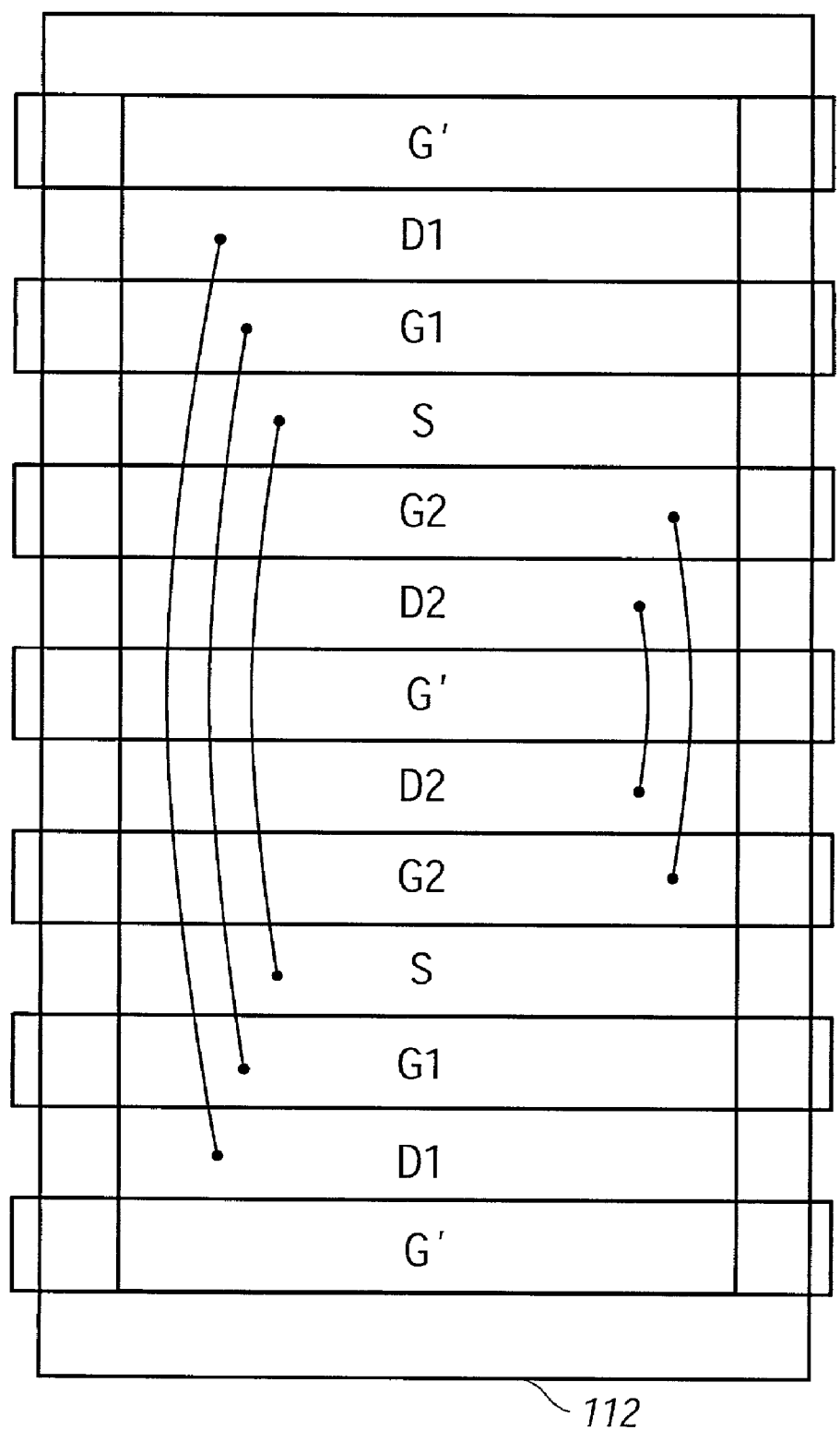
FIG. 7 shows a linearly coupled layout according to a preferred embodiment.

The idea behind isolating the transistors with an insulating barrier, combined with positioning the transistors so that asymmetric external effects will be countered, is continued in another embodiment shown in FIG. 7. This figure shows a linear series of transistors that are coupled together as shown. Two shared sources are surrounded by gates for different transistors, gates 1 and 2. This structure is repeated on the lower half of the diagram, the two halves being separated by a G' which is held at source voltage.

This variation linearly couples the transistors by connecting D1 at the top to D1 at the bottom, D2 with D2, and the two shared sources. Connection is accomplished with existing metallization steps in the process. The gates are also shown coupled in this variation.

By linearly coupling these devices, more robust performance matching against thermal gradients is achieved. Some external thermal sources create nonlinear gradients, which are particularly problematic for current mirrors, op amps, and other performance matching devices. By coupling the sources and drains in this way, changes in performance due to thermal gradients are reduced or eliminated. Temperature changes occurring due to a thermal source to the side of this setup will of course affect each device roughly equally since the front of any temperature change will reach each device nearly equally. Temperature changes occurring from an external source to the top or bottom of the devices, however, typically cause more problems because they will affect, for example, the top set of coupled transistors more than it they affect the more distant bottom set of transistors. Though the isolating oxide barrier helps in equalizing temperature within the barrier, cross coupling the top devices to the bottom devices ensures that a thermal gradient from the linear direction is reasonably similar for both devices in the matched pair.

Further protection against large external heat sources can be achieved by adding another linearly coupled set of devices next to that shown in FIG. 7, and cross coupling them. Such a setup is shown in FIG. 8.

Figure 8:
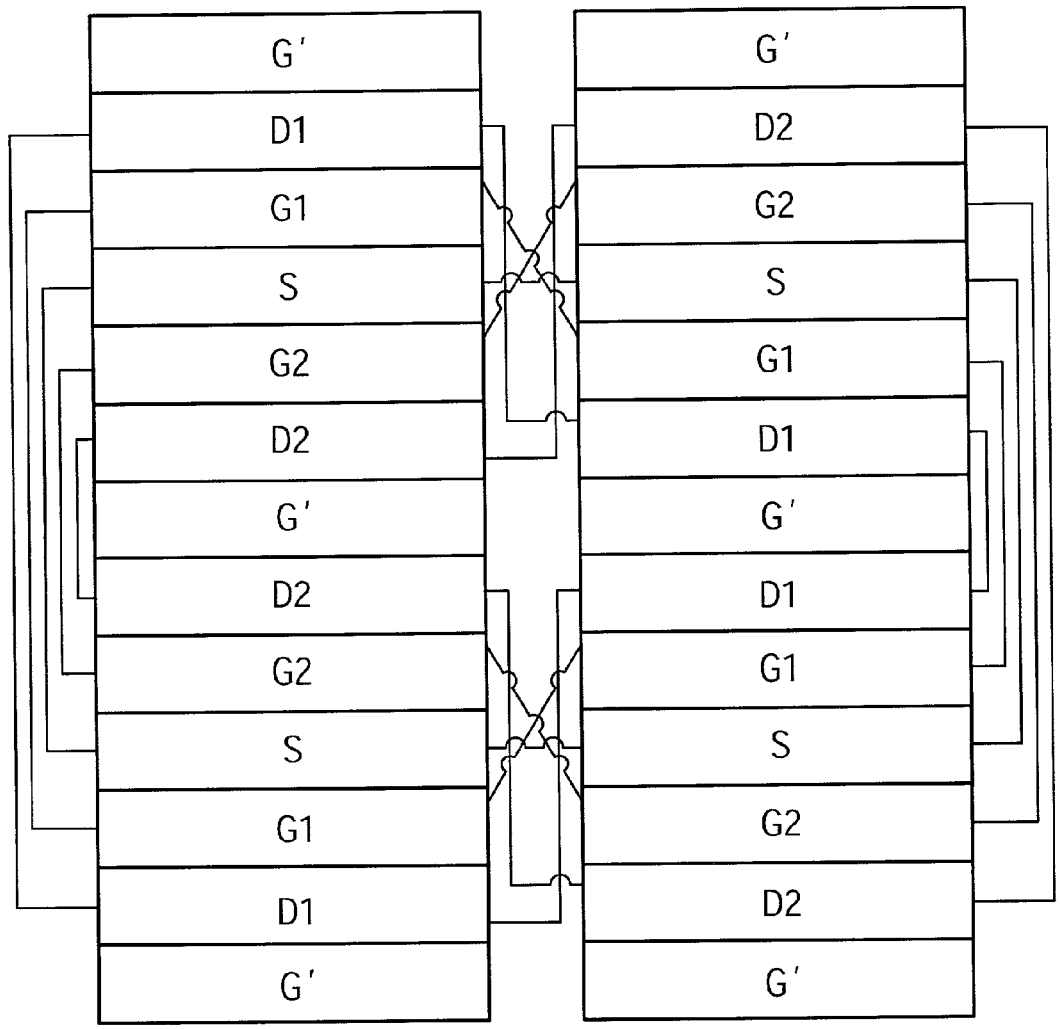
FIG. 8 shows two linearly coupled layouts according to a preferred embodiment.

In FIG. 8, the linearly coupled, shared source transistors are connected to another set of linearly coupled, shared source transistors. The sources of the left half couple to the sources of the right half, the gates couple, as do the drains. However, in the case of the gates and drains, D2 and D1 are switched with respect to the first, left hand set of linearly coupled transistors. As shown in the figure, this puts the D2 drain at the top of the figure (where D1 is located on the left-hand set), and D1 below this one (where D2 is located on the left-hand set). This modification of course requires that the gates also be rearranged to match. The shown devices are surrounded by an insulating oxide wall as the other embodiments, but the oxide barrier is not shown in this figure for simplicity.

Incorporating this change into the device means that a thermal gradient coming from the top or the bottom of the figure will affect both D1 and D2 at the same spatial location. This is important especially for non-linear thermal gradients, where temperature can change greatly over a small distance. By coupling the left device set with the right device set as shown, and insulating the entire setup with an insulating barrier, thermal control and stability is maximized.

Figure 9:
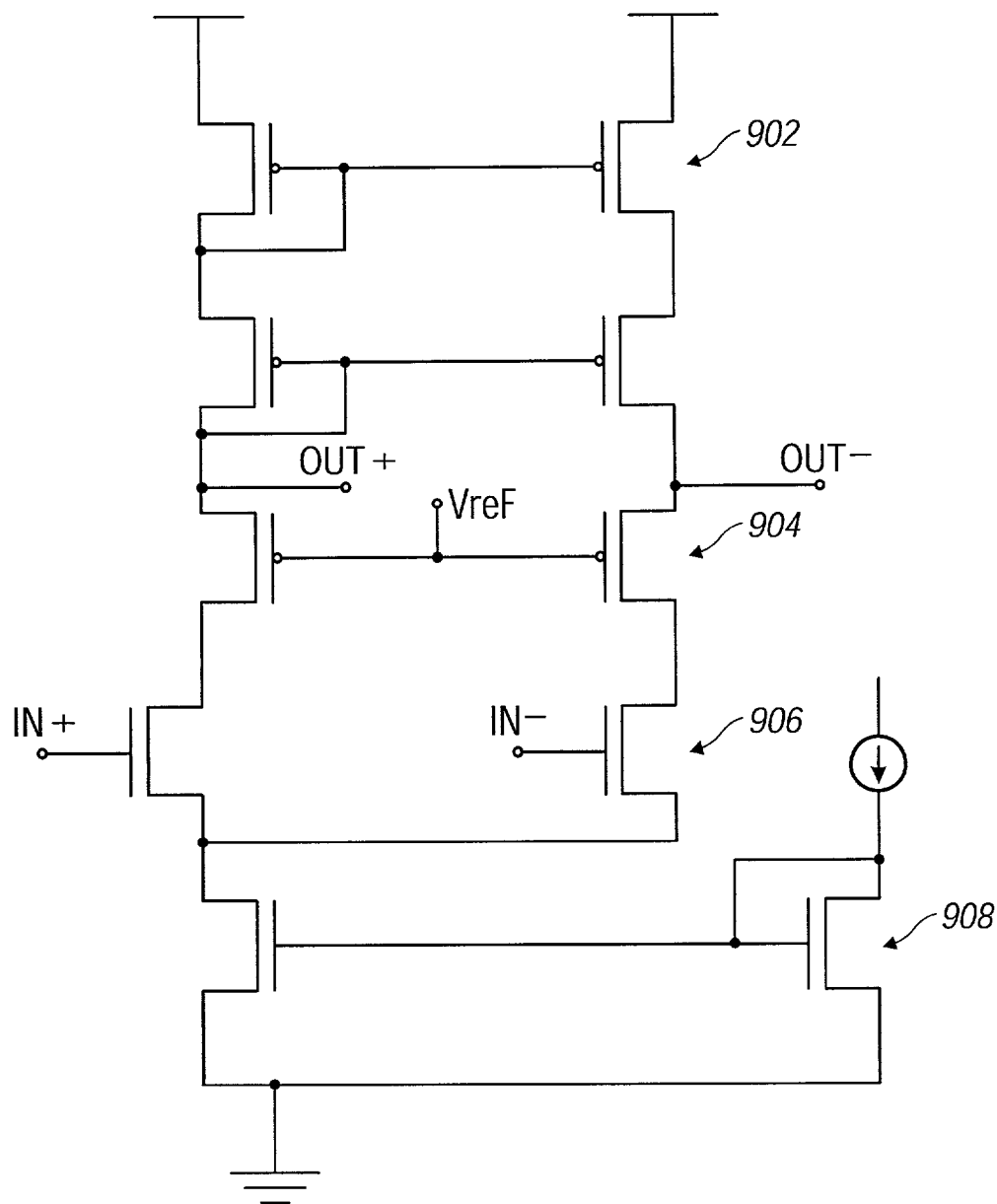
FIG. 9 shows an example circuit implementing preferred embodiments.

FIG. 9 shows a cascode pair for implementing a preferred embodiment of the present innovations. Several PMOS transistors are linked to form the circuit comprising three current mirrors and the input pair and output. A two-stage mirror 902 is shown at the top of the figure, followed by a cascode pair 904. Beneath this is the input pair 906 and finally another current mirror 908.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

Tank—a continuous region of active material.
Body—the active region beneath the channel of a MOS semiconductor device.
SOI—Semiconductor On Insulator.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The teachings above are not necessarily strictly limited to silicon. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

Though many of the example embodiments herein described refer to NMOS or PMOS devices in particular, it should be noted that the present innovations are applicable to either type of transistor and variants thereof, for example, LDMOS and bipolar structures. The specific examples given are not intended to limit the scope of the inventions.

The present innovations are contemplated to be particularly useful in such performance matching devices as current mirrors, cascode pairs, sense amplifiers, and differential input pairs, for example.

The present innovations are also applicable in other technologies that require close operation of devices, such as memory or other systems requiring flip flops. For example, matched cells in SRAM can benefit from the presently disclosed innovations.

The ideas herein described are not limited to applications in analog circuit stages. For example, some memory applications (such as SRAM, mentioned above) can use the present innovations, as well as, for example, logic stages where matched timing along two critical paths in a digital circuit is needed.

It should also be noted that, over time, an increasing number of functions tend to be combined into a single chip. The disclosed inventions can still be advantageous even with different allocations of functions among chips, as long as the functional principles of operation described above are still observed.

Additional general background, which help to show the knowledge of those skilled in the art regarding variations and implementations of the disclosed inventions, may be found in the following documents, all of which are hereby incorporated by reference: Bernstein and Rohrer, SOI CIRCUIT DESIGN CONCEPTS (2000).

What is claimed is:

1. An integrated circuit semiconductor-on-insulator structure, comprising:
   a pair of matched transistors, in a circuit stage which requires matched behavior of said pair; and
   a physical connection of semiconductor material which provides thermal conduction between respective bodies of said pair of transistors, but does not carry current during normal operation of said circuit stage; and
   an insulating material which totally surrounds at least a part of said circuit stage.

2. The integrated circuit of claim 1, wherein said circuit stage is an analog circuit stage.

3. The integrated circuit of claim 1, wherein said circuit stage is a matched pair of current-sourcing P-channel transistors in a current mirror.

4. The integrated circuit of claim 1, wherein said circuit stage is a cascode pair.

5. The integrated circuit of claim 1, wherein said circuit stage is an input pair of a differential analog stage.

6. An integrated circuit semiconductor-on-insulator circuit structure, comprising:
   a pair of transistors in an analog circuit stage which requires matched behavior of said pair;
   a physical connection of metallic material which provides thermal conduction between respective bodies of said pair of transistors; and
   an insulating layer beneath said pair;
   an insulating barrier substantially surrounding said pair and extending to said insulating layer.

7. The integrated circuit of claim 6, wherein said analog circuit stage is a current mirror.

8. The integrated circuit of claim 6, wherein said analog circuit stage is a matched pair of current-sourcing P-channel transistors in a current mirror.

9. The integrated circuit of claim 6, wherein said physical connection comprises metal interconnects between said transistors of said pair.

* * * * *

UNITED STATES PATENT AND TRADEMARK OFFICE
CERTIFICATE OF CORRECTION

PATENT NO. : 7,397,085 B2
APPLICATION NO. : 10/007332
DATED : July 8, 2008
INVENTOR(S) : Andrew Marshall It is certified that error appears in the above-identified patent and that said Letters Patent is hereby corrected as shown below:

Title page item [60], the Provisional application No. "60/279,980" should be --60/279,960--.

Signed and Sealed this

Seventh Day of October, 2008

JON W. DUDAS
*Director of the United States Patent and Trademark Office*